United States Patent [19]

Ralph

[11] Patent Number: 4,862,228
[45] Date of Patent: Aug. 29, 1989

[54] HIGH MOBILITY SEMICONDUCTOR DEVICES

[75] Inventor: Hugh I. Ralph, Lewes, England

[73] Assignee: U.S. Philips Corp., New York, N.Y.

[21] Appl. No.: 38,806

[22] Filed: Apr. 15, 1987

[30] Foreign Application Priority Data

Apr. 16, 1986 [GB] United Kingdom ............. 8609337

[51] Int. Cl.$^4$ ............. H01L 29/203; H01L 29/205; H01L 29/80
[52] U.S. Cl. .......................... 357/4; 357/16; 357/22
[58] Field of Search ................ 357/4, 16, 22

[56] References Cited

U.S. PATENT DOCUMENTS 4,665,415  5/1987  Esaki et al. .................... 357/16

OTHER PUBLICATIONS

Sze, Physics of Semiconductor Devices (2nd Ed., 1981, Wiley, New York), p. 849.

*Primary Examiner*—William D. Larkins
*Attorney, Agent, or Firm*—Steven R. Biren

[57] ABSTRACT

A high mobility p channel semiconductor device (such as a field-effect transistor) is suitable for operation at room temperature, for example in a circuit with an n channel device. Whereas hole modulation doping both in single heterojunction and in heterstructure quantum well devices provides a significant increase in hole mobility only at cryogenic temperatures, the present invention employs less than 5 nm wide and very deep quantum wells (about 0.4 eV and deeper) to reduce the effective mass of "heavy" conduction holes for motion in the plane of the quantum well. Hole mobilities at 300 degrees K. are obtained in excess of 2.5 times those in bulk material of the same narrow bandgap semiconductor as used for the quantum well. In a particular example such a quantum well is formed of GaAs (or GaInAs) between AlAs barrier layers.

15 Claims, 1 Drawing Sheet

HIGH MOBILITY SEMICONDUCTOR DEVICES

BACKGROUND OF THE INVENTION

This invention relates to high mobility semiconductor devices having a conduction channel of p type conductivity formed as one or more heterostructure quantum wells, and relates particularly but not exclusively to field-effect transistors which are formed of III–V compound semiconductor materials and which may be operated at room temperature.

U.S. Pat. No. (US-A) 4,163,237 discloses high mobility semiconductor devices (and in particular a field-effect transistor) having a conduction channel formed as a heterostructure comprising a plurality of layers of narrow bandgap semiconductor material interleaved with doped layers of wide bandgap semiconductor material. The channel extends longitudinally along the plane of the quantum well with conduction charge carriers of the channel being confined in the direction of thickness of the layers by the quantum well.

Conduction occurs in the narrow bandgap material by means of charge carriers supplied by the doped wide bandgap layers. This effect is nowadays termed "carrier modulation doping" of the narrower bandgap material which may itself be substantially undoped. By thus removing conduction electrons from impurity-doped layers where scattering occurs, an enhanced electron mobility results as compared with electron mobility arising from impurity doping of the narrower bandgap material without the heterostructure. The improvement is particularly significant at cryogenic temperatures.

It is recognized in US-A 4,163,237 that when the thickness of the narrow bandgap layers is of the order of a few hundred Angstroms, i.e. a few tens of nanometers (nm), the energy levels therein will be quantized in both the conduction and valence bands. Thus, in this situation each narrow bandgap layer forms a quantum well with the wider bandgap material acting as barrier layers. Arbitrary quantized levels $E_1'$, $E_2'$ and $E_3'$ are illustrated inside the conduction and valence bands in FIG. 2 of US-A 4,163,237. Several structures were fabricated with layer thicknesses ranged from 100 to 400 Angstroms (10 to 40 nm), and it is noted that the results obtained for mobility improvement were found to be substantially independent of layer thickness in this range.

Most of the devices described in US-A 4,163,237 have n type conductivity, in which case the wide bandgap layers are doped n type with donor impurity and the heterostructure exhibits a conduction band step sufficiently large to confine electrons to the narrower bandgap layers. Particular examples of GaAs layers interleaved with n type GaAlAs wide bandgap layers are described. Both GaAs and GaAlAs are semiconductor materials having cubic lattice symmetry of the zincblende type. It is also proposed that p type conductivity devices may be formed when the wide bandgap layers are doped p type with acceptor impurity and the heterostructure exhibits a valence band step sufficiently large to confine holes to the narrower bandgap layers. No particular examples are given, it being noted that n type wide bandgap layers are preferred because electron mobility generally exceeds hole mobility.

In subsequent years, instead of using many interleaved layers, high mobility devices (and particularly field-effect transistors) have been formed with single heterojunctions providing carrier modulation doping from a doped wider bandgap material (particularly GaAlAs) to an undoped narrower bandgap material (particularly GaAs). This move from GaAs/GaAlAs quantum wells to single heterojunction devices avoids a need to grow good quality GaAs on doped GaAlAs. As a result of coulomb attraction between the ionized impurity in the wider bandgap material and the carriers in the narrower bandgap material, the carriers are held within about 10 to 30 nm of the interface with the wider bandgap material, so forming a so-called 2-dimensional carrier gas in the narrower bandgap material. This approach has been successfully adopted to form high electron mobility transistors (HEMTs) using undoped GaAs and n doped GaAlAs and operating at low temperatures. Such transistors are also termed MODFETs for modulation doped field-effect transistors. Even at room temperature (300° K.) a slight improvement in electron mobility may be obtained compared with bulk GaAs whose electron mobility at 300 degrees K. is about 8500 $cm^2V^{-1}s^{-1}$.

Since complementary conductivity type devices are desirable for circuits with lower power dissipation, potentially increased speed and improved noise margins, the same single heterojunction approach has been adopted for p type conductivity channel devices. Hole mobility in bulk GaAs material which is not intentionally doped at 300 degrees K. is only at most about 400 $cm^2V^{-1}s^{-1}$, but p channel MODFETs have been constructed using undoped GaAs and p doped GaAlAs having hole mobilities as high as 3650 $cm^2V^{-1}s^{-1}$ at 77° K. and 54000 $cm^2V^{-1}s^{-1}$ at 4.2° K., as described in for example the article entitled "P-channel MODFETs using GaAlAs/GaAs Two-dimensional Hole Gas" in IEEE Electron Device Letters, Vol. EDL-5, No. 8, August 1984 page 333 to 335. However, such a device is unattractive for complementary transistor circuit application at 300 degrees K. since its room temperature characteristics imply an average mobility of less than 200 $cm^2V^{-1}s^{-1}$, which is even less than the hole mobility in bulk GaAs at 300 degrees K.

Temperature dependance of the mobility of two-dimensional hole systems in modulation-doped GaAs/AlGaAs is analysed in an article under that title in Applied Physics Letters, Vol. 44 No. 1, January 1984, pages 139 to 141. Results are given for both single heterojunction structures and superlattices having interleaved layers forming multiple heterojunctions. In all cases in order to achieve hole mobilities in excess of $1 \times 10^3 cm^2V^{-1}s^{-1}$ (i.e. in excess of 2.5 times that in bulk GaAs at 300 degrees K.), it is necessary to cool the device, for example to about 200 degrees K. and less. Also it is noted that the shapes and values of the hole mobility/temperature curve for single heterojunction structures and for superlattices are very similar; neither is a significant improvement over the other, although the hole mobility in the single heterojunction structure tends to be slightly higher than that in the superlattice.

SUMMARY OF THE INVENTION

According to the present invention a high mobility semiconductor device having a conduction channel of p type conductivity formed as at least one quantum well, the quantum well being a heterostructure provided by a layer of narrow bandgap semiconductor material located between p type doped barrier layers of wide bandgap semiconductor material, the semiconductor materials each having cubic lattice symmetry, the channel extending longitudinally along the plane of the quantum well with conduction holes of the channel being confined in the direction of thickness of the layers by the quantum well, is characterized in that the quantum well is less than 5 nm wide and is so deep in energy that conduction along the channel is by holes of reduced mass having at 300 degrees K. a mobility in excess of 2.5 times the mobility of conduction holes in bulk material of said narrow bandgap semiconductor at 300 degrees K. Thus, for quantum well layers based on III-V compound semiconductor materials, such as gallium arsenide for example, the conduction holes of reduced mass in the plane of such a quantum well may have a mobility in excess of $1 \times 10^3 cm^2 V^{-1} s^{-1}$ at 300 degrees K.

The present invention is based on a recognition by the present inventor that a very significant reduction in the mass of conduction holes along the channel (and hence a significant increase in hole mobility even around 300 degrees K. and in high field drift velocity) can be achieved by confining the conduction holes in the direction of thickness of the layers with one or more quantum wells which are much narrower (less than 5 nm) in width than that required merely for quantization and which are much deeper in hole energy than that required merely to produce a valence band step for confining the holes to the narrow bandgap material. This permits the design of high mobility p channel transistors for operation at room temperature.

It is the inventor's understanding that this mass reduction arises in the following manner - a fuller consideration is given later with reference to FIG. 2. In bulk semiconductor material (such as III-V compounds) crystallized in a zincblende type cubic lattice structure there are two energy level bands at the top of the valence band which are degenerate at zero momentum; these two are commonly designated as those of "heavy" holes which behave as though they have a spin quantum number ($m_j$) of $\pm 3/2$ and "light" holes which behave as though they have a spin quantum number ($m_j$) of $\pm \frac{1}{2}$, the spin quantization being in the direction of motion of the hole. Although both "light" and "heavy" holes normally coexist in bulk material, there are many more "heavy" holes than "light" ones so that it is primarily the "heavy" holes that contribute to the electrical properties of the material. When the quantum mechanical symmetry is reduced by providing a quantum well, these "light" and "heavy" hole energy levels at zero momentum are separated but the level of lowest hole energy and hence preferred occupancy is that of the "heavy" hole ($m_j \pm 3/2$ when the momentum in the plane of the well is zero). Thus "heavy" holes again predominate in the quantum well. However by making the quantum well both very deep and sufficiently narrow (less than 5 nm wide) the "heavy" hole mass effective for motion in the plane of the well is found to be reduced so significantly as to become like a light hole in its inertia. Furthermore the splitting of the two hole levels ($m_j + 3/2$ and $+\frac{1}{2}$) becomes sufficiently large that the velocity of the lightened "heavy" hole can become large before the hole is scattered, and inter-hole scattering is largely eliminated even at and around room temperature (300 degrees K.) and with high electric fields.

Designing devices with this understanding permits hole mobilities significantly in excess of $1 \times 10^3 cm^2 V^{-1} s^{-1}$ to be achieved at 300 degrees K., for example with a quantum well of GaAs or a ternary compound based on GaAs. Hole mobilities at 300 degrees K. of $3 \times 10^3 cm^2 V^{-1} s^{-1}$ and more, for example 4 or even $5 \times 10^3 cm^2 V^{-1} s^{-1}$, can be achieved. Experiments with p type conductivity modulated quantum wells indicate that the mass of the "heavy" hole for quantum well widths of more than 5 nm is not significantly less (and may even be slightly greater) than that in bulk material, but that with a sufficiently narrow width (less than 5 nm) the mass reduces significantly in a deep well. Calculations indicate that the in-plane mass of the "heavy" hole in such a quantum well can be reduced to as small as a quarter (or even less) of that in bulk material, for example GaAs.

In order to form adequately deep quantum wells based on GaAs, it is desirable to form the barrier layers of a material such as AlAs. The well may be deepened further by forming the quantum well layer of a ternary compound material such as gallium indium arsenide. The use of GaInAs wells with AlAs barriers also introduces a lattice mismatch causing the well material to have a biaxial compressive strain. Both effects increase the separation of the hole energy levels and enhance the reduction in mass of the conduction holes in the quantum well. However, other materials may be used for the quantum well and barrier layers.

BRIEF DESCRIPTION OF THE DRAWING

These and other features in accordance with the present invention will now be illustrated in specific embodiments, by way of example, to be described with reference to the accompanying diagrammatic drawings, in which.

Figure 1:
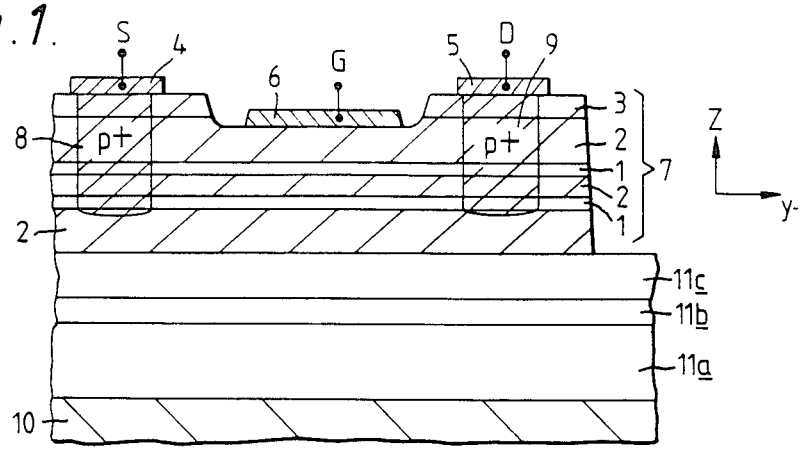
FIG. 1 is a cross-sectional view of part of a device in accordance with the invention, comprising a high mobility p channel field-effect transistor.

It should be noted that all the drawings are diagrammatic and not drawn to scale. Various dimensions and proportions in the cross-sectional views of FIGS. 1 and 3 have been exaggerated or diminished for the sake of convenience and clarity in the drawings, and undoped parts of GaAs and AlAs are not hatched in these Figures. Furthermore it should be noted that in FIG. 2 the hole designations of $m_j = \pm 3/2$ and $m_j = \pm \frac{1}{2}$ only relate to "heavy" and "light" hole character at $k_y = 0$ and that the exact shape of these curves in $k_y$ space in the narrow quantum well varies for different materials and is not precisely known even for GaAs, FIG. 2 being merely a diagrammatic representation.

DESCRIPTION OF THE PREFERRED EMBODIMENTS

The device of FIG. 1 comprises a high mobility field-effect transistor having a conduction channel 7 of p type conductivity formed as a plurality of heterostructure quantum wells 1. Each quantum well is provided by a layer 1 of narrow bandgap III-V compound semiconductor material (for example, gallium arsenide or gallium indium arsenide) located between p type doped barrier layers 2 of wide bandgap III-V compound material (for example, aluminum arsenide). These semiconductor materials 1 and 2 each have cubic lattice symmetry of the zincblende type. The channel 7 extends longitudinally along the plane of the quantum wells 1, the current path being defined between an input 8 and an output 9 which are laterally spaced in a longitudinal direction (y) of the layers 1 and 2. Conduction holes which carry the current in the channel 7 are confined in the direction of thickness (z) of the layers 1 and 2 by the quantum wells 1.

In accordance with the present invention each quantum well 1 is less than 5 nm wide (i.e. the layer 1 is less than 5 nm thick) and is so deep in energy that conduction along the channel 7 is by holes of reduced mass having a mobility in excess of $1 \times 10^3 \text{cm}^2 \text{V}^{-1}\text{s}^{-1}$ at 300 degrees K. The mobility improvement at 300 degrees K. for conduction holes of reduced mass which is achievable with the use of narrow and very deep quantum wells 1 in accordance with the invention is in excess of 2.5 times the mobility of conduction holes in bulk material of the same narrow bandgap semiconductor at 300 degrees K. Conduction hole mobilities for commonly used GaAs and InAs bulk materials are about 400 and 450 $\text{cm}^2\text{V}^{-1}\text{s}^{-1}$ respectively at 300 degrees K. However the invention may be used with semiconductor materials having even higher bulk mobility to give even higher conduction hole mobilities in the plane of the quantum wells 1.

Due to the valence band step at the heterojunction between layers 1 and 2 the p type impurity in wider bandgap material 2 supplies the conduction holes to the narrower bandgap material 1 so that channel conduction occurs in the quantum well layers 1 by carrier modulation doping. Thus, as previously suggested in US-A 4,163,237, the mobility is increased by reducing carrier scattering at impurities. This is achieved by having the quantum well layers 1 substantially undoped, i.e. unintentionally doped. The effect is primarily significant for low temperature operation (particularly below 70 degrees K.). It seems uncertain at present that modulation doping by itself in a quantum well can result in any significant mobility improvement at room temperature, particularly as the initial effect of introducing a heterostructure tends to be a slight reduction in hole mobility at 300 degrees K. as compared with using bulk material.

However, in accordance with the present invention a much more significant increase in hole mobility at room temperature is achieved by making the quantum well 1 both much deeper in hole energy than that required merely to confine the holes to the undoped narrower bandgap material and much narrower in width than that required merely for quantization. The results of this situation in separating energy levels and in reducing the effective mass of the conduction holes is illustrated in FIG. 2.

Figure 2:
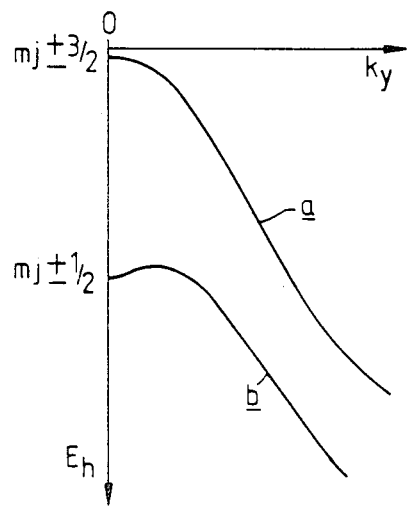
FIG. 2 is a representation of hole energy $E_h$ versus wave vector $k_y$ which is a measure of quasi momentum in such a quantum well channel for a direction of motion y parallel to the plane of the quantum well layer.

FIG. 2 illustrates hole energy levels a and b in such a quantum well 1 based on GaAs, the top of the valence band being formed by the level a which is lowest in hole energy $E_h$. When the channel 7 comprises a plurality of the quantum well layers 1 interleaved with the p type doped barrier layers 2, the intermediate barrier layers 2 should normally be made sufficiently thick to confine the conduction holes to the individual quantum wells 1 in the direction of thickness of the layers, thereby maintaining the holes in a 2-dimensional system. Otherwise quantum mechanical coupling of the wells 1 will produce a superlattice effect broadening each of the levels a and b into wide bands of levels. However coupling between the wells may be included, although this will usually be avoided so as to maintain a maximum separation between the levels a and b in the quantum well.

In bulk GaAs crystal material the energy level bands which are important in hole conduction correspond to levels for holes which behave as though they have spin quantum numbers $m_j$ of $\pm 3/2$ and $m_j$ of $\pm \frac{1}{2}$, with the spin quantization in the direction of motion of the hole. In the bulk material the two spin states ($\pm 3/2$ and $\pm \frac{1}{2}$) of these holes are degenerate at zero momentum (k=0), but the $\pm 3/2$ spin state has a broader curvature in k-space, so being preferentially occupied and having a heavier mass than the $\pm \frac{1}{2}$ spin state. For this reason these two spin states are normally designated as those of "heavy" holes for $m_j = \pm 3/2$ and "light" holes for $m_j = \pm \frac{1}{2}$. This difference in effective mass for the different spin states is one effect which the cubic lattice environment has on the kinetic energy of the hole. A second effect is that the mass of the hole is anisotropic, having cubic symmetry. This anisotropic mass effect is particularly severe for the "heavy" holes, there being almost a 2:1 ratio between the masses in the 111 and 100 directions. The effective mass for conduction holes is an average combination of these anisotropic masses. The effective mass $m_{hh}$ of the "heavy" hole ($m_j = \pm 3/2$) in bulk GaAs is about 0.5 $m_e$ where $m_e$ is the mass of a free electron. The "heavy" hole is about five times heavier than the "light" hole. The effective masses of conduction "heavy" holes in other commonly used III-V compound semiconductor bulk materials are also between about 0.4 $m_e$ and 0.6 $m_e$.

When the quantum mechanical symmetry is reduced by confining the holes in the z direction to a quantum well 1, the degeneracy is lifted and "light" and "heavy" hole energy levels are separated even at $k_y = 0$ (and $k_x = 0$) as illustrated in FIG. 2 by curves b and a respectively. The z direction is the direction of thickness of the layer 1 (i.e. the width of the quantum well), whereas y and x are taken as directions along the plane of the quantum well (i.e. along the channel 7 and perpendicular thereto). When it is stated in the subsequent discussion that $k_y = 0$ it should also be assumed that $k_x = 0$, i.e. the hole is at rest for all directions along the plane of the quantum well 1. The level of lowest hole energy and hence of preferred occupancy is level a, i.e. still that of the "heavy" hole ($m_j \pm 3/2$).

However, in accordance with the invention the quantum well 1 is made so very deep and sufficiently narrow (less than 5 nm wide) that the level a is steeply curved in k-space in the x and y directions so that the "heavy" hole mass effective for motion in the plane of the well is reduced so significantly as to become like a light hole. The rate of change of slope ($d^2E/dk_y^2$) in $k_y$-space at $k_y = 0$ is inversely proportional to the mass, and by having a sufficiently narrow and very deep quantum well the conduction holes in the device can be retained in the "heavy" hole level a but with an effective mass of less a half, preferably less than a third of that of the conduction holes in bulk material, i.e. an increase in $d^2E/dk_y^2$ of more than 3 times. Indeed, under appropriately optimized conditions, the "heavy" hole mass (line a) can approach about 0.11 $m_e$ (i.e. less than a quarter of that in bulk GaAs and other common III-V bulk materials). For hole motion along the channel, $k_y$ is greater than zero; however an increased $d^2E/dk_y^2$ is still maintained as illustrated by the curvature of the line a for $k_y$ values greater than zero in FIG. 2. The factor $d^2E/dk_y^2$ should be kept large for these greater $k_y$ values so that the hole velocity becomes as large as possible before the hole is scattered. The hole mass is inversely proportional to $d^2E/dk_y^2$ while the curve a is parabolic, but this factor $d^2E/dk_y^2$ still remains inversely proportional to a measure of inertia when the curve a becomes non-parabolic.

The separation of the two hole levels a and b is so large in such a narrow and very deep quantum well that level a remains close to a parabolic curve up to higher $k_y$ values and occupancy of the higher energy level b becomes insignificant for the most part, thereby reducing the effect of level b on conduction and largely eliminating inter-hole scattering even for devices operating around room temperature and with high electric fields e.g. during turn off of a field-effect transistor. The separation between levels a and b is desirably at least 100 meV at $k_y=0$. This is much greater than k.T where k is the Boltzmann constant and T is the absolute temperature, even in the case of devices operating at room temperature (k.T is about 25 meV for T=300° K.). Even if the device is designed for lower temperature operation, an energy separation of at least 100 meV will still be desirable generally to prevent scattering between levels a and b from values of $k_y$ corresponding to high hole velocities achieved in high fields occurring in the device. This ensures that the saturation drift velocity of holes in the channel 7 will not be significantly impaired by inter-hole scattering.

The general conditions of a very deep and very narrow quantum well are required both to reduce the effective hole mass in level a for motion in the plane of the well and to separate the levels a and b by as much as possible. However for any particular choice of materials for the quantum well layer(s) 1 and barrier layers 2 and for any particular depth of well it is expected that the optimum well width for minimum mass will not coincide exactly with that for maximum separation of the levels a and b. Nonetheless a quantum well width of between 1 and 3 nm will commonly provide good results, at least for most of the III–V compound materials which it may be desired to use. For GaAs quantum well layers 1 a thickness of about 1.5 to 2 nm seems optimum.

It should be noted that in bulk material hole spin is defined relative to the direction of motion of the hole, whereas the z direction of thickness of layer 1 defines the quantization direction for hole energy in a quantum well 1. When the hole has zero momentum along the plane of the quantum well 1 (i.e. $k_y=0$ and $k_x=0$) its spin may be compared with those of holes in bulk material (i.e. a "heavy" hole spin $m_j$ of $\pm 3/2$, and a "light" hole spin $m_j$ of $\pm \frac{1}{2}$). However when the hole has momentum along the plane of the well, its spin axis is no longer defined as aligned with the z direction (perpendicular to the plane of the well 1) so that these $m_j$ designations of $\pm 3/2$ and $\pm \frac{1}{2}$ are not used for the energy curves in FIG. 2 for values of $k_y$ greater than zero. The lines a and b can however still be related to holes of the types which behave as though they have, at zero momentum along the plane of the well, spin quantum numbers of $m_j=\pm 3/2$, and $m_j=\pm \frac{1}{2}$ respectively.

With the GaAlAs material normally used for heterojunctions with GaAs channels of MODFETs, an adequately deep quantum well cannot be formed to achieve the benefits of the present invention even if the width of such a GaAs quantum well between GaAlAs barrier layers were made less than 5 nm in width. A much deeper well is required in order to obtain an adequate separation of the energy levels a and b and a suitable increase in $d^2E/dk_y^2$ (and hence reduction in mass) over an adequate range of momentum space $k_y$. Generally a quantum well depth of at least 0.4 eV and preferably at least 0.5 eV or more is desirable. Thus, to form a quantum well for a device in accordance with the invention the barrier layers 2 may both be of aluminum arsenide when the quantum well layer 1 is of either gallium arsenide or a mixed-crystal ternary compound material which comprises gallium arsenide and which produces a larger valence band step than does gallium arsenide. The valence band step between AlAs and GaAs is about 0.5 eV. By incorporating indium in such a mixed crystal with the GaAs the quantum well 1 is made deeper and is also given a biaxial compressive strain which further increases the separation of the levels a and b. The magnitude of the effect increases with increasing indium arsenide mole fractions in the gallium indium arsenide material.

The effect of strain in splitting "heavy" and "light" hole levels in gallium indium arsenide is considered in the article "Optical investigation of a new type of valence-band configuration in InGaAs/GaAs strained superlattices" in Physical Review B, Vol. 31 No. 12, pages 8298 to 8301 published by The American Physical Society. In the GaInAs well, the "light" hole band lies at a higher hole energy (lower electron energy) than the "heavy" hole band and in fact even lies at a higher hole energy than the valence band edge in the adjacent GaAs layers as a result of which the "heavy" holes and electrons are confined in the GaInAs layers while the "light" holes are confined in the GaAs layers. This so-called type II superlattice effect for the "light" holes does not occur in the heterostructures of the present invention which use quantum wells which are very much deeper (typically 0.4 eV or more) and also narrower (less than 5 nm). Conduction hole mass reduction is effected quite differently in accordance with the present invention.

Figure 3:
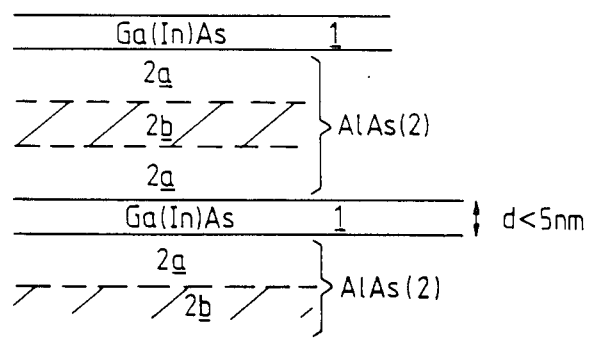
FIG. 3 is a cross-sectional view of part of the barrier layer and intermediate quantum well layer heterostructure for the channel of such a transistor in accordance with the invention.

The present invention provides a significant reduction in the effective "heavy" hole mass which is the conduction hole mass effective for motion in the plane of the quantum well 1 (and hence along the conduction channel 7). The mobility is not only inversely proportional to this mass but is also proportional to the carrier lifetime. Thus, in addition to providing a wide separation between the hole energy levels a and b to suppress inter-hole scattering, other precautions which are already known are taken to reduce scattering at impurity centers and at the interfaces between the quantum well layers 1 and the barrier layers 2. Thus, as illustrated in FIG. 3, the p type doping impurity is not merely restricted to the barrier layers 2, but is kept away from the part 2a of the barrier layer 2 which adjoins the quantum well layer 1. Such a feature and its advantages are already disclosed in US-A 4,163,237. When using molecular beam epitaxy (MBE) to form the layers 1 and 2, the Knudsen cells containing the p type doping impurity are shuttered closed during the growth of not only the quantum well layer 1 but also the final and initial growth stages of the barrier layers 2 adjacent the wells 1 so that any impurities incorporated into the layer(s) 1 and layer parts 2a result primarily from background contamination in the MBE ultra high vacuum system. The undoped parts 2a are not illustrated with the hatching convention used in FIG. 1, but only in FIG. 3. Typically these substantially undoped layer parts 2a will be made much thicker than the thin quantum well layers 1; thus, the undoped layer parts 2a may, for example, be grown as thick as 10 nm or more.

Furthermore, it is found that when GaAs is grown on top of AlAs, the interface tends to be rougher (and causes more scattering) than that of AlAs on GaAs, and the first such interface following AlAs growth may getter impurities which had accumulated on the growing AlAs surface from the substrate. In order to reduce this tendency, the heterostructure for the transistor of FIG. 1 may be provided after growing a complex buffer layer structure on the substrate 10, as follows:

The substrate 10 may be of semi-insulating Cr-doped GaAs or substantially undoped GaAs and have a (100) crystal orientation. A buffer layer 11a of undoped GaAs having a thickness of several $\mu$m (micrometers) may first be grown, followed by a layer 11b of undoped GaAlAs which may be, for example, about 50 nm in thickness. The buffer structure may be completed by growing a superlattice structure 11c having a total thickness of about 150 nm and formed as thin multiple sublayers of undoped GaAs with interleaved sublayers of undoped GaAlAs or undoped AlAs. There may be a progressive increase in the thickness of the interleaved GaAlAs or AlAs sublayers (and in the AlAs mole fraction for GaAlAs sublayers) from the layer 11b to the first AlAs barrier layer 2. Then the first AlAs barrier layer 2 is grown with a p type doping concentration of for example $10^{17}$ to $10^{18}$ or more of Be or Zn atoms $cm^{-3}$. The impurity doping is stopped before growing the last part 2a of the first barrier layer 2. Furthermore, buried within this first AlAs barrier layer 2, a very thin GaAs (or GaInAs) quantum well layer (thinner than the layer 1) may be grown at a depth where it is separated from the quantum well layer 1 by at least the undoped layer part 2a and where it is beyond the contact depth of the source and drain regions 8 and 9.

Next the quantum well layer 1 of GaAs or of GaInAs typically between 1.5 and 2.5 nm in thickness is grown without any intentional doping, followed by the thicker undoped part 2a of the next AlAs barrier layer 2. The doped part 2b of the AlAs second barrier layer 2 is then grown with the same impurity doping, and the sequence 2a, 1, 2a, 2b is repeated to provide however many quantum wells 1 are desired.

A single quantum well 1 may be adequate for a low signal transistor, although it will generally be desirable to have a plurality of wells 1 for the channel for higher current devices. In this case, as described previously, it is usually preferable to grow the intermediate barrier layers 2 sufficiently thick to prevent significant superlattice coupling of the individual wells 1 so as to maintain a good separation between the quantized hole energy levels a and b. Such intermediate barrier layers 2 may be, for example, about 25 nm thick, whereas particularly the uppermost barrier layer 2 will generally be grown thicker. Particularly for a barrier layer 2 located between two quantum wells 1, the thickness of the part 2b over which that barrier layer is impurity doped may be considerably less than the total thickness of both parts 2a (and even the thickness of one part 2a) over which it is substantially undoped. A layer 3 of GaAs may also be grown on the uppermost AlAs barrier layer 2 to act as a surface protection layer and to aid the formation of ohmic contacts.

P type source region 8 and p type drain region 9 may be formed by an alloy of Au with Zn or Be; they are locally alloyed through the uppermost barrier layer 2 and the intermediate barrier layer(s) 2 so as to contact the quantum well layers 1. Source and drain electrodes 4 and 5 (for example of Au) are deposited on the source and drain regions 8 and 9. A gate 6 is provided between the source and drain regions 8 and 9, for example in a recess as illustrated in FIG. 1 in order to obtain better control of the channel 7 by field-effect action. The gate 6 may form a Schottky junction with the uppermost barrier layer 2, or it may be provided on a dielectric layer to form an insulated gate structure.

The p channel field-effect transistor of FIG. 1 may be isolated laterally by etching through the thickness of the layer structure 1,2 to reach the buffer layer 11 and leave the transistor in a mesa on the substrate 10. It will be evident that other layers may be grown to form an n channel field-effect transistor beside the p channel device. Such growth of other layers may be carried out on top of the heterostructure for the p channel transistor, before forming the source and drain regions 8 and 9 and the electrodes 4, 5 and 6. The n-channel heterostructure layers are then wholly etched away at areas where the p channel transistor is to be formed. There are known a large variety of n channel transistor technologies which may be used to form the n channel device. The n channel transistor is isolated vertically from the underlying p type heterostructure layers by an intermediate p-n junction. Depending on the temperatures and other processing parameters used in the n channel transistor fabrication, it may be preferable to reverse the sequence so as to form the p channel heterostructure after forming the n channel heterostructure on the substrate 10. The hole mobility in the p channel transistor constructed in accordance with the invention may be at least a quarter or even a half of the electron mobility in the n channel transistor, both operating at room temperature.

Although the specific example of a GaAs-based quantum well 1 between AlAs barrier layers 2 has been described and has particular advantages, other materials may be used to form a p channel quantum well heterostructure in accordance with the invention. Thus, for example a valence band quantum well of about 0.4 eV can be formed between barrier layers 2 of indium phosphide and a quantum well layer 1 of indium gallium arsenide. Such a heterostructure may be used to form a device in accordance with the invention, having its quantum well layer(s) less than 5 nm thick. When the mole fraction of GaAs is 0.47, the InGaAs is lattice-matched to the InP, and the quantum well is about 0.38 eV deep. However different mole fractions may be used to vary the valence band step and to introduce strain and to separate further the hole energy levels a and b. Other wide and narrow bandgap semiconductor materials of the zincblende lattice type may be used to form very deep and narrow (less than 5 nm wide) quantum wells 1 in devices in accordance with the invention. Quantum wells may also be formed based on germanium and silicon which have cubic symmetry of the diamond lattice type, and it appears that a similar reduction in the effective mass of "heavy" conduction holes can be obtained with this type of semiconductor crystal material by forming narrow (less than 5 nm wide) and very deep quantum wells.

Although only a field-effect transistor is illustrated in FIG. 1, the invention may be used to provide other types of high mobility semiconductor devices having a conduction channel of p type conductivity. Furthermore although the invention permits the construction of high mobility p channel devices for room temperature operation, devices in accordance with the invention may be designed for lower temperature operation, it being noted that the mobility of the conduction holes in the channel 7 increases further with cooling.

I claim:

1. A high mobility semiconductor device having a conduction channel of p type conductivity formed as at least one quantum well, the quantum well being a heterostructure provided by a layer of narrow bandgap semiconductor material located between p type doped barrier layers of wide bandgap semiconductor material, the semiconductor materials each having cubic lattice symmetry, the channel extending longitudinally along the plane of the quantum well with conduction holes of the channel being confined in the direction of thickness of the layers by the quantum well, and comprising means for increasing the mobility of conduction holes in said channel by making the quantum well width less than 5 nm and the quantum well depth sufficiently deep such that conduction along the channel is by holes of reduced mass having at 300 degrees K. a mobility in excess of 2.5 times the mobility at 300 degrees K. of conduction holes in bulk material of said narrow bandgap semiconductor which is not intentionally doped.

2. A device as claimed in claim 1, further characterized in that the quantum well is so deep and sufficiently narrow that conduction in the channel is by holes which have in the plane of the quantum well an effective mass of less than a third of that of conduction holes in bulk material of said narrow bandgap semiconductor.

3. A device as claimed in claim 1 or 2, further characterized in that the narrow and wide bandgap materials are III-V compound semiconductors, and that the mobility of the conduction holes of reduced mass is in excess of $1 \times 10^3 cm^2 V^{-1} s^{-1}$ in the plane of the quantum well at 300 degrees K.

4. A device as claimed in claim 1 or 2, further characterized in that the width of the quantum well is between 1 and 3 nm.

5. A device as claimed in claim 1 or 2, further characterized in that the quantum well depth is at least 0.4 eV.

6. A device as claimed in claim 1 or 2, further characterized in that the barrier layers are both of aluminum arsenide, and in that the quantum well layer of the narrow bandgap material is of either gallium arsenide or a ternary compound material which comprises gallium arsenide and which produces a larger valence band step than gallium arsenide.

7. A device as claimed in claim 6, further characterized in that the ternary compound material is gallium indium arsenide.

8. A device as claimed in claim 6, further characterized in that there is present between the aluminum arsenide barrier layers and the ternary compound material a lattice mismatch which enhances the reduction in mass of the conduction holes in the quantum well.

9. A device as claimed in claim 1 to 2, further characterized in that the barrier layers are both of indium phosphide and the quantum well layer of the narrow bandgap material is indium gallium arsenide.

10. A device as claimed in claim 1 or 2, further characterized in that the quantum well layer of the narrow bandgap material is substantially undoped, and the conduction holes in said layer are supplied by carrier modulation doping from the p type doped barrier layers.

11. A device as claimed in claim 10, further characterized in that the barrier layers are substantially undoped immediately adjacent to the quantum well layer of the narrow bandgap material.

12. A device as claimed in claim 11, comprising two quantum wells and characterized in that, at least for a barrier layer located between said two quantum wells, the thickness over which that barrier layer is doped is less than the thickness over which it is substantially undoped.

13. A device as claimed in claim 12, wherein, at least for a barrier layer located between two quantum wells, the barrier layer thickness is about 25 nm with a thickness of the barrier layer of about 10 nm immediately adjacent the quantum wells being substantially undoped.

14. A device as claimed in claim 1 or 2, further characterized in that the quantum well layer of the narrow bandgap material provides the p type conductivity channel of a field-effect transistor.

15. A device as claimed in claim 14, further characterized in that the p type conductivity channel comprises a plurality of the quantum well layers of the narrow bandgap material which are interleaved with the p type doped barrier layers of the wide bandgap material, the barrier layers being sufficiently thick to confine the conduction holes to the individual quantum wells in the direction of thickness of the layers.

* * * * *